United States Patent
Seki et al.

(10) Patent No.: US 10,360,315 B2
(45) Date of Patent: Jul. 23, 2019

(54) CONSTRUCTION FIELD MANAGEMENT METHOD AND CONSTRUCTION FIELD MANAGEMENT DEVICE

(75) Inventors: Hiroshi Seki, Tokyo (JP); Satoshi Shimakura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 1037 days.

(21) Appl. No.: 14/349,247

(22) PCT Filed: Oct. 3, 2011

(86) PCT No.: PCT/JP2011/072744
§ 371 (c)(1),
(2), (4) Date: Apr. 2, 2014

(87) PCT Pub. No.: WO2013/051080
PCT Pub. Date: Apr. 11, 2013

(65) Prior Publication Data
US 2014/0257764 A1 Sep. 11, 2014

(51) Int. Cl.
*G06F 17/50* (2006.01)
*G06Q 50/08* (2012.01)
(Continued)

(52) U.S. Cl.
CPC ..... *G06F 17/5004* (2013.01); *G06Q 10/0631* (2013.01); *G06Q 10/103* (2013.01); *G06Q 50/08* (2013.01)

(58) Field of Classification Search
CPC ............ G06F 17/5004; G06Q 10/0631; G06Q 10/103; G06Q 50/08
See application file for complete search history.

(56) References Cited

U.S. PATENT DOCUMENTS

| 8,249,909 B2 | 8/2012 | Watanabe et al. |
| 2010/0256940 A1* | 10/2010 | Ogawa ................ G01S 7/4812 702/97 |
| 2011/0164029 A1* | 7/2011 | King ................... G06F 3/04883 345/419 |

FOREIGN PATENT DOCUMENTS

| JP | 7-49910 A | 2/1995 |
| JP | 2000-357010 A | 12/2000 |

(Continued)

OTHER PUBLICATIONS

Zaki Mallasi, "Dynamic quantification and analysis of the construction workspace congestion utilizing 4D visualization," 2006, Automation in Construction, vol. 15, pp. 640-655.*

(Continued)

*Primary Examiner* — Kamini S Shah
*Assistant Examiner* — Russ Guill
(74) *Attorney, Agent, or Firm* — Crowell & Moring LLP

(57) ABSTRACT

The object is to enable easy acquisition of an element that is not design data. The technique is characterized in that when generating construction field management information used to manage a construction field, a construction field management device acquires measurement data that is three-dimensional shape data measured by a measurement device, and compares design data created by a designer with the acquired measurement data, thus extracting non-design data that is not the design data, from the measurement data. Also, as the non-design data, data of a scaffolding/tool and a component of the design data in a temporarily placed state are extracted, and the status of these is analyzed and displayed on a display unit.

15 Claims, 23 Drawing Sheets

(51) Int. Cl.
  *G06Q 10/06* (2012.01)
  *G06Q 10/10* (2012.01)

(56) References Cited

FOREIGN PATENT DOCUMENTS

| | | |
|---|---|---|
| JP | 2002-73730 A | 3/2002 |
| JP | 2003-35037 A | 2/2003 |
| JP | 2005-275723 A | 10/2005 |
| JP | 2005-331383 A | 12/2005 |
| JP | 2009-46946 A | 3/2009 |
| JP | 2010-108321 A | 5/2010 |
| WO | WO 2012/117833 A1 | 9/2012 |

OTHER PUBLICATIONS

Frederic Bosche, "Automated recognition of 3D CAD model objects in laser scans and calculation of as-built dimensions for dimensional compliance control in construction," 2010, Advanced Engineering Informatics, vol. 24, pp. 107-118.*

Frederic Nicolas Bosche et al., "Automated recognition of 3D CAD objects in site laser scans for project 3D status visualization and performance control," 2009, Journal of Computing in Civil Engineering, vol. 23(6), pp. 1-24.*

Yelda Turkan et al., "Automated progress tracking of erection of concrete structures," Jun. 2011, Annual Conference of the Canadian Society for Civil Engineering, pp. 1-10.*

Y. Wu et al., "Digital Imaging in Assessment of Construction Project Progress," 2004, Proceedings of the 21st International Symposium on Automation and Robotics in Construction (ISARC), six pages.*

International Search Report dated Dec. 6, 2011 w/ English translation (two (2) pages).

* cited by examiner

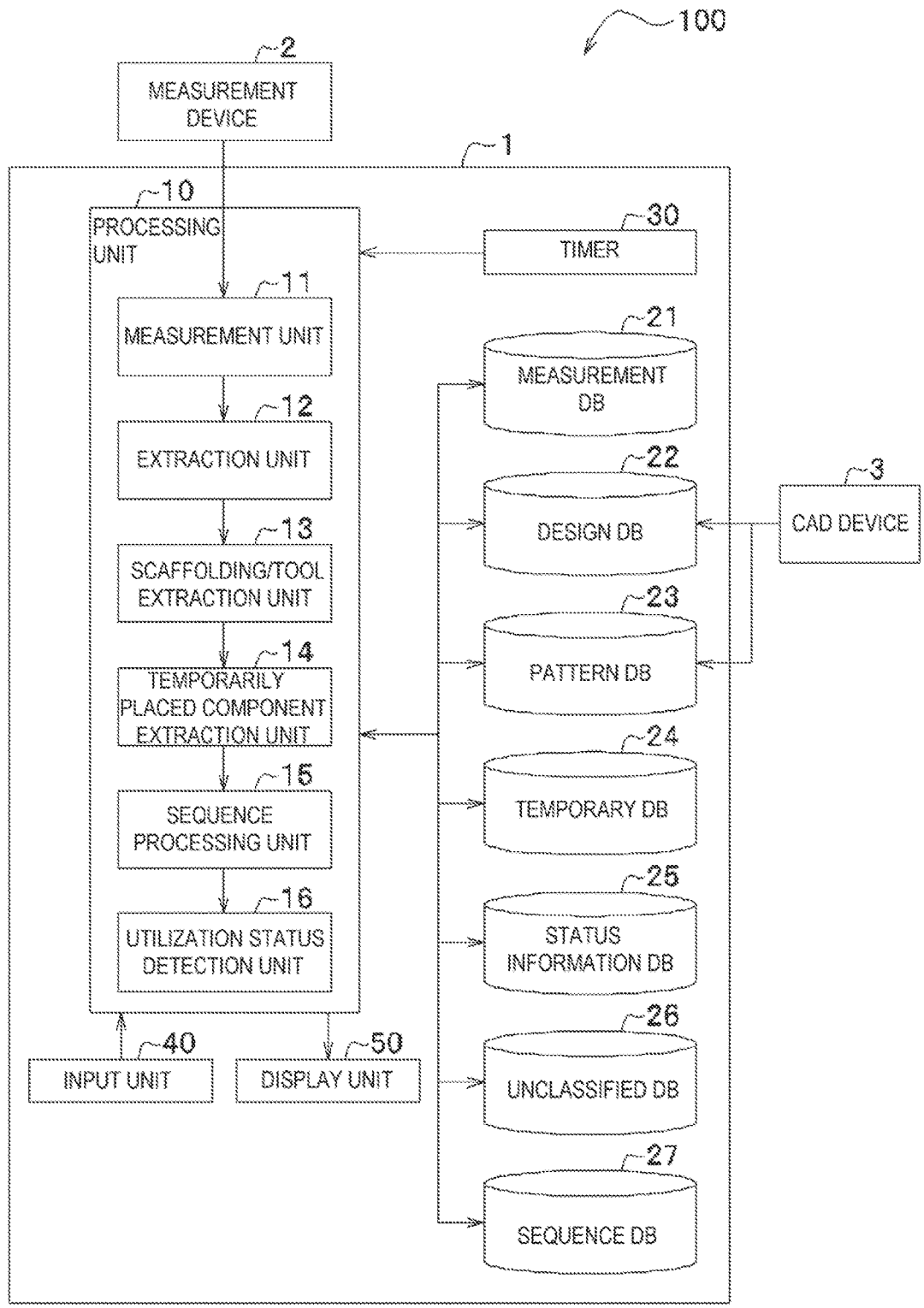

[FIG. 2]
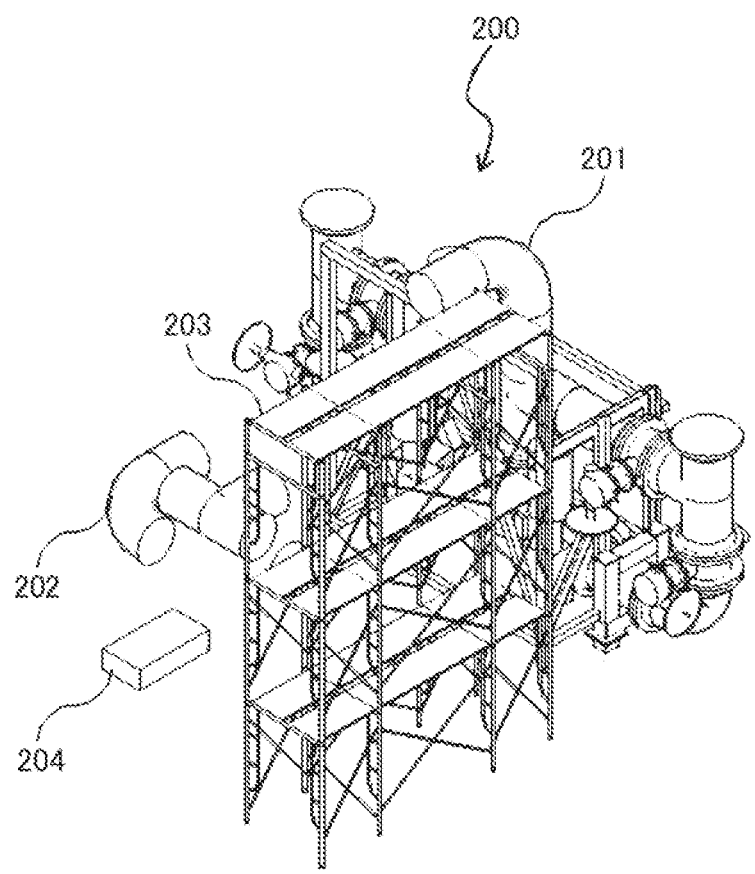

[FIG. 3]
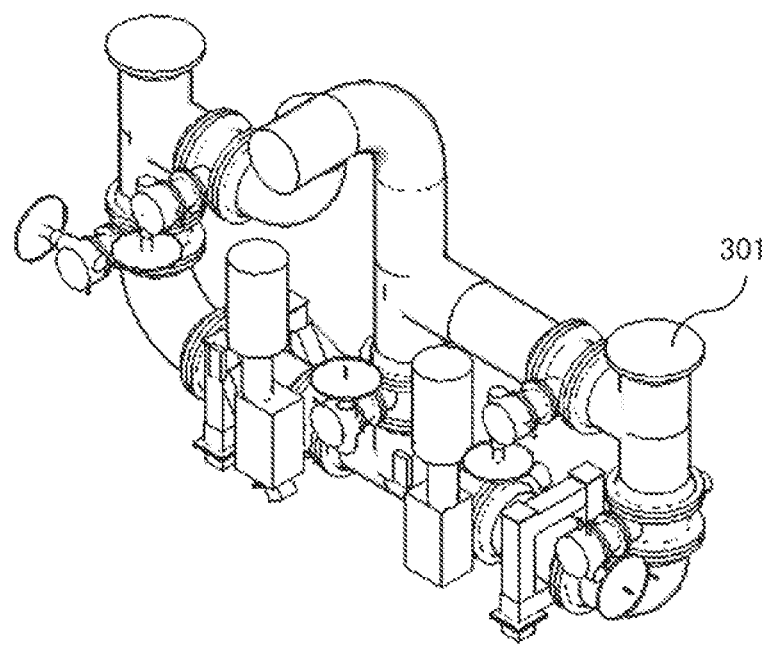

[FIG. 4]
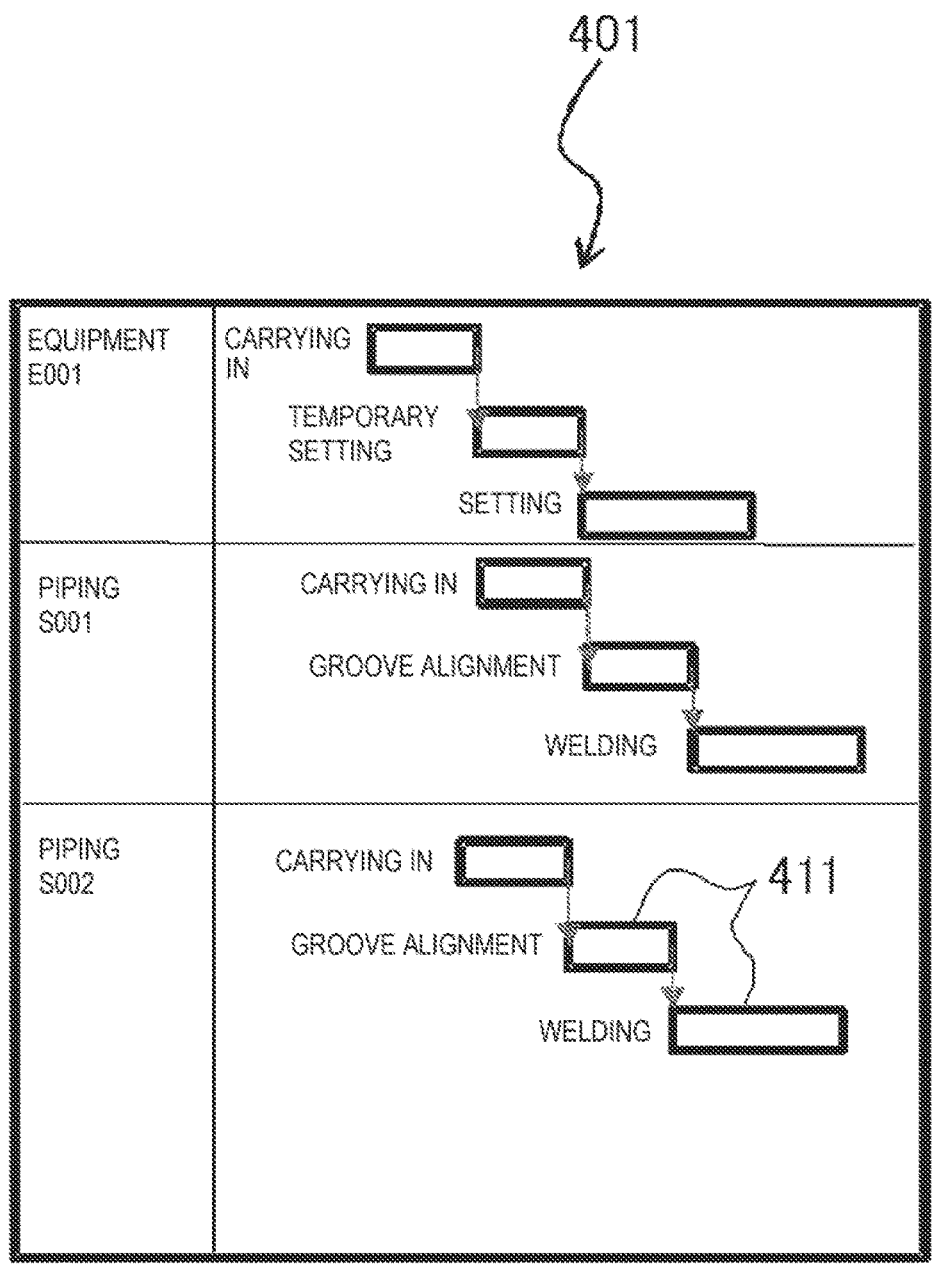

[FIG. 5]
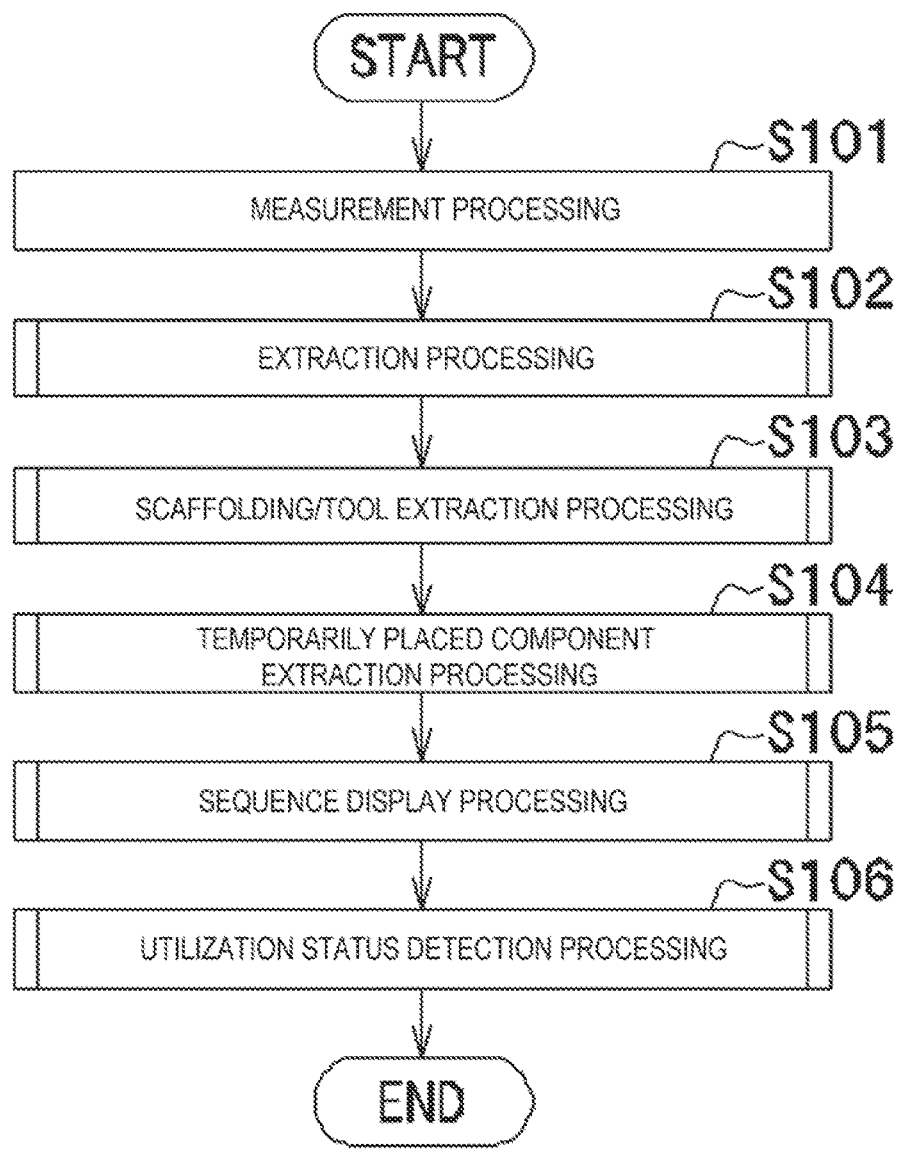

[FIG. 6]
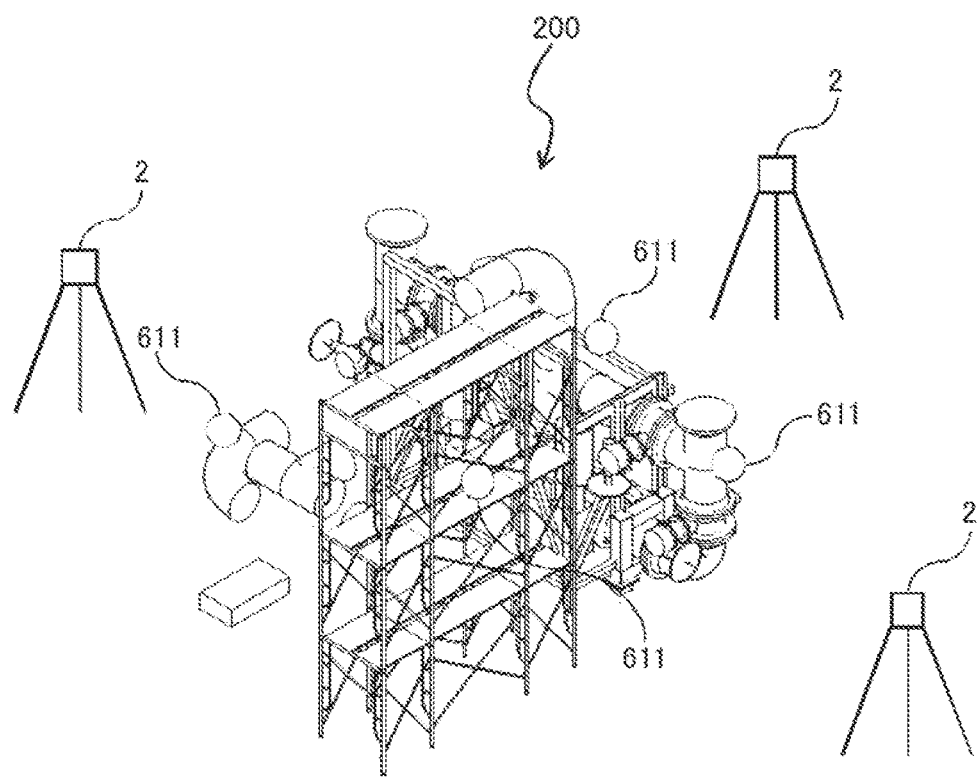

[FIG. 7]

| X | Y | Z | R | G | B | time |
|---|---|---|---|---|---|---|
| 493509.88 | 4245673.18 | 32.00 | 255 | 255 | 0 | 160025.9540 |
| 493511.98 | 4245674.49 | −31.86 | 255 | 255 | 0 | 160025.9540 |
| ⋮ | ⋮ | ⋮ | ⋮ | ⋮ | ⋮ | ⋮ |

[FIG. 8]
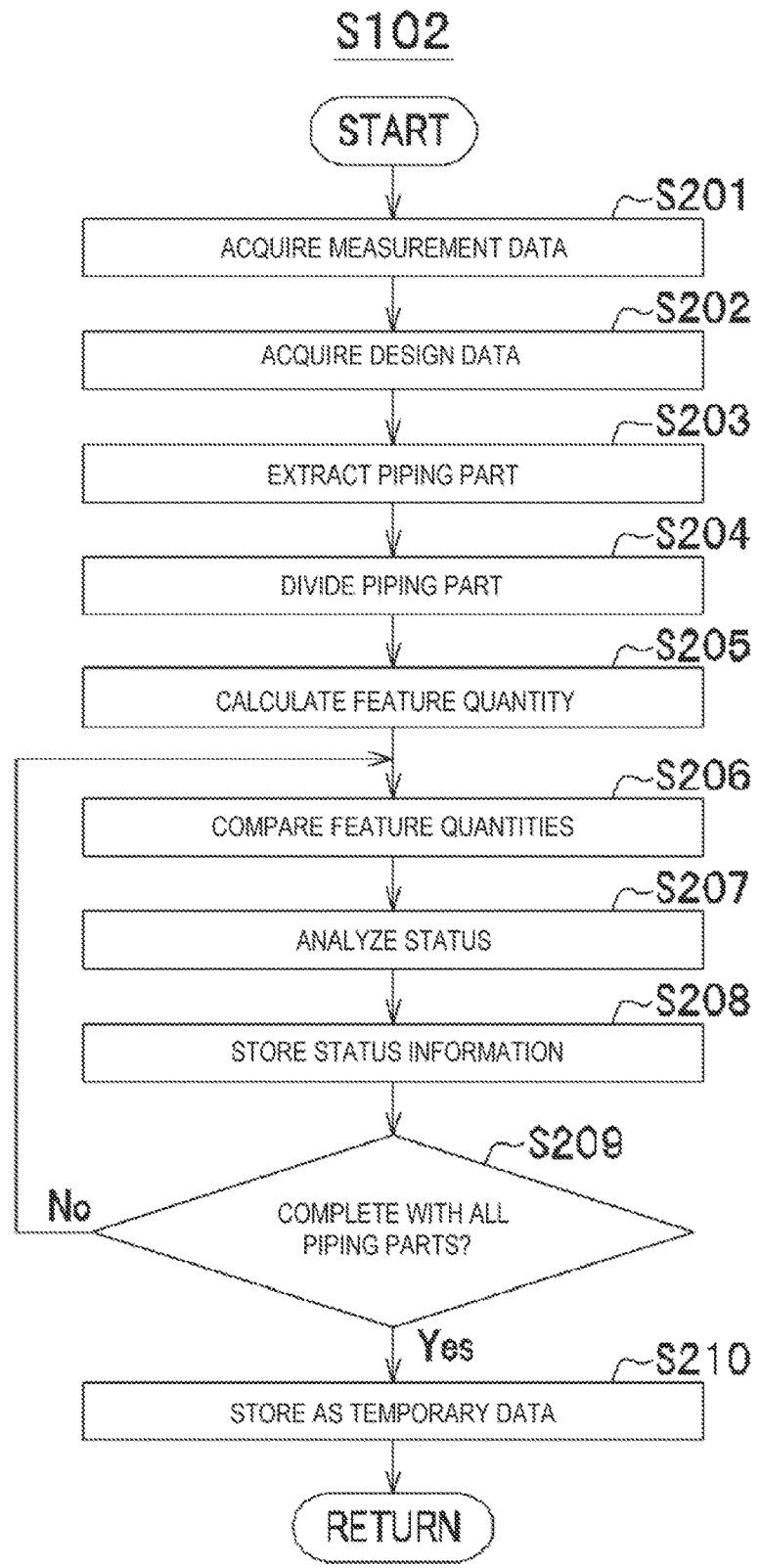

[FIG. 9]
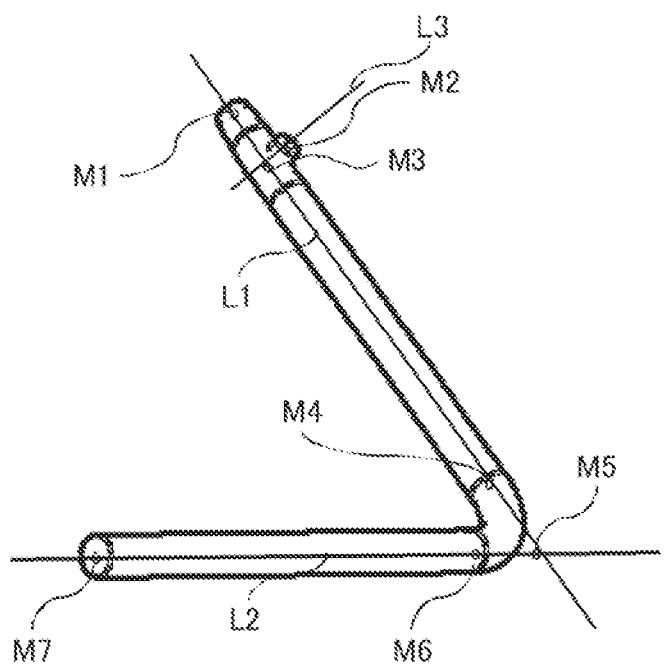

[FIG. 10]

| COMPONENT ID | WORK DIAGRAM NUMBER | CONSTRUCTION AREA | STATUS | REFERENCE COORDINATES |
|---|---|---|---|---|
| S001 | D1001 | R001 | INSTALLED | (1010, 10050, 6010) |
| S002 | D1002 | R001 | TEMPORARILY PLACED | (1500, 10700, 6500) |
| ⋮ | ⋮ | ⋮ | ⋮ | ⋮ |

[FIG. 11]
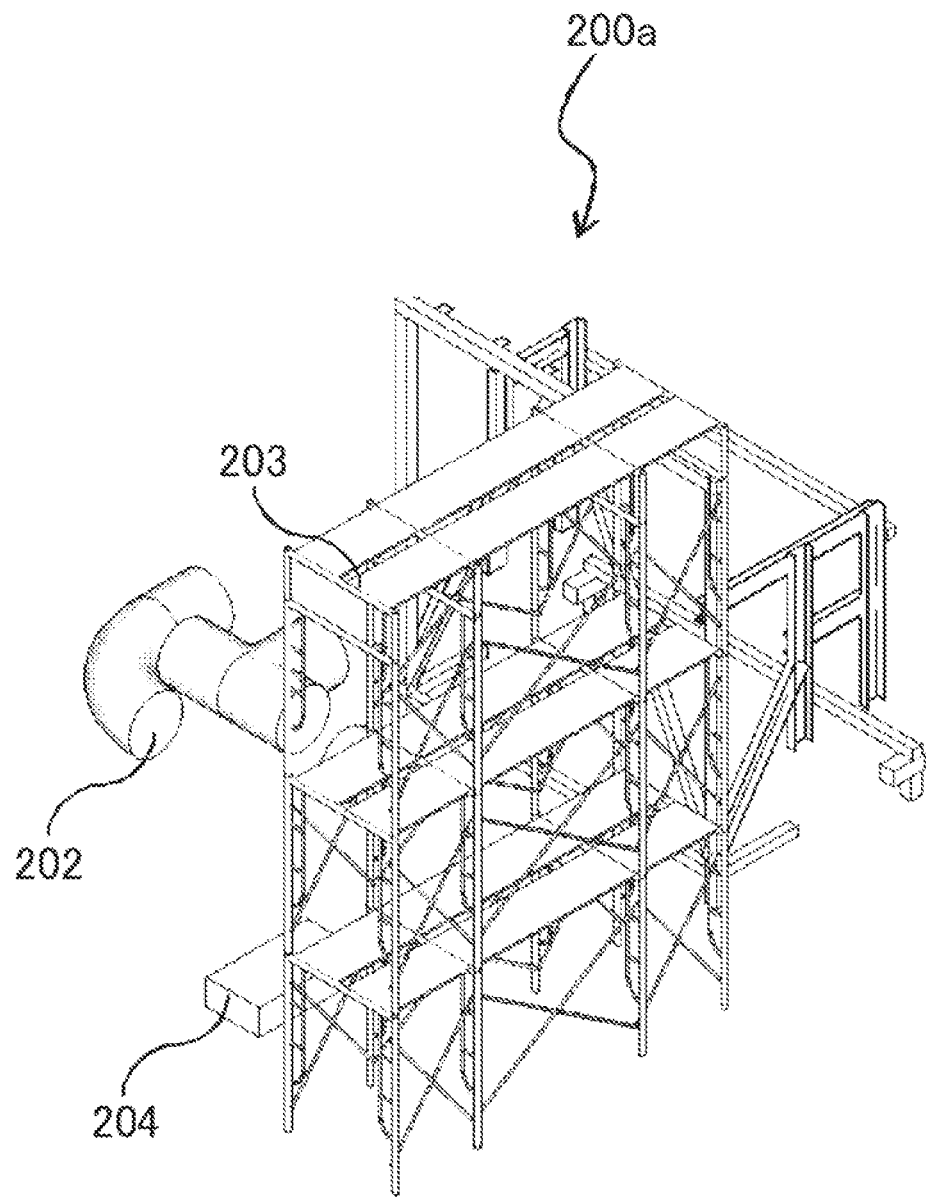

[FIG. 12]
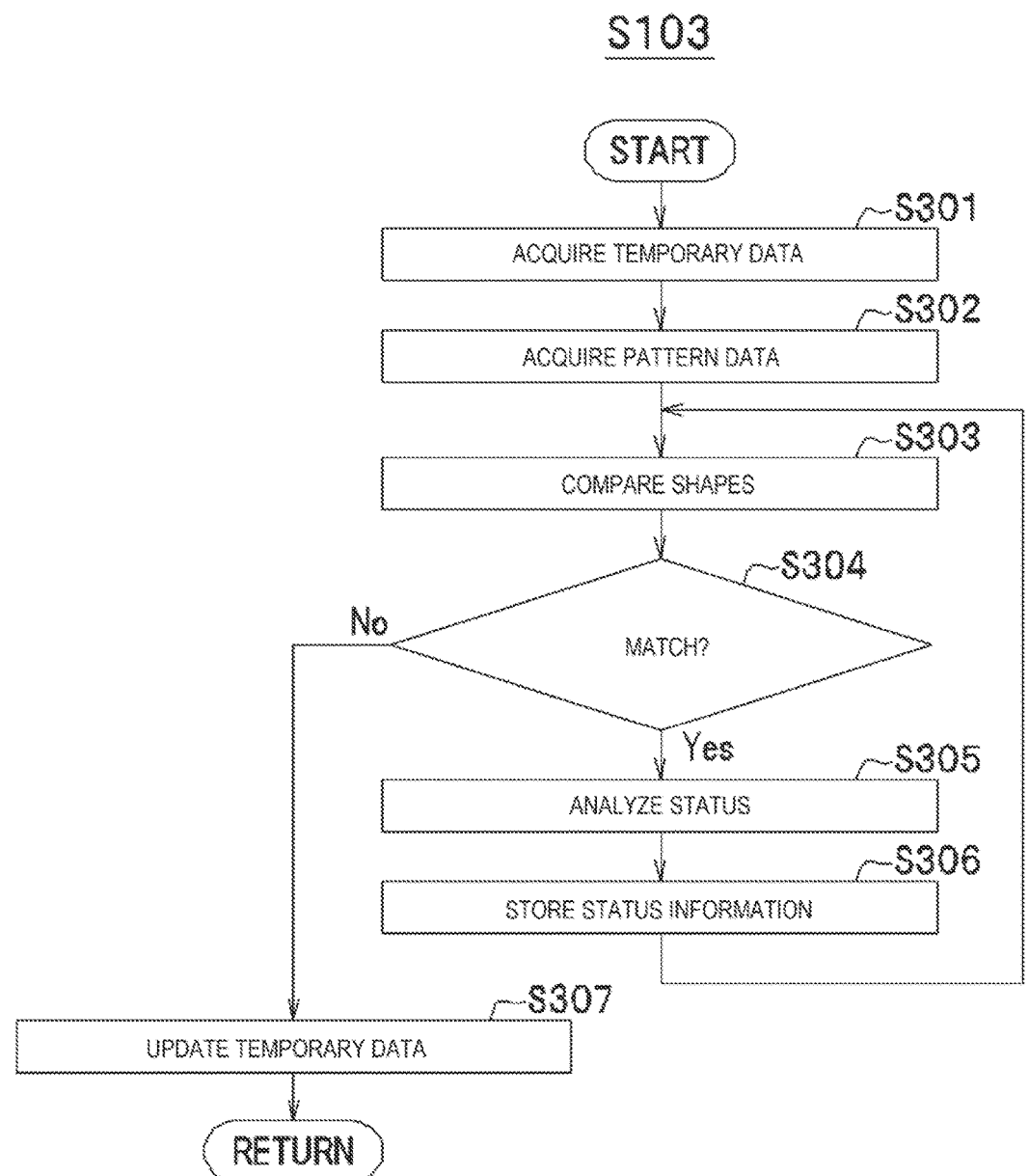

[FIG. 13]
| TYPE | NAME | PARAMETER | SHAPE |
|---|---|---|---|
| SC | STANDARD SCAFFOLDING | NUMBER OF STEPS<br>LENGTH<br>WIDTH<br>NUMBER OF UNITS | 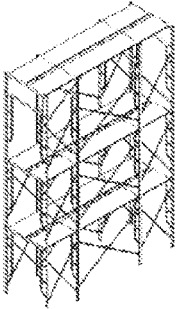 |
| ... | ... | ... | ... |
| WM | TYPE-A WELDER | OUTPUT<br>SIZE<br>NUMBER OF UNITS |  |
| ... | ... | ... | ... |

[FIG. 14]

| COMPONENT ID | CLASSIFICATION | TYPE | CONSTRUCTION AREA | NAME | STATUS | REFERENCE COORDINATES |
|---|---|---|---|---|---|---|
| SC011 | SCAFFOLDING | SC | R001 | STANDARD SCAFFOLDING | ALREADY INSTALLED | (1000, 10000, 8010) |
| TL001 | TOOL | TL | R001 | WELDER | — | (2000, 10000, 6500) |
| ... | ... | ... | ... | ... | ... | ... |

[FIG. 15]
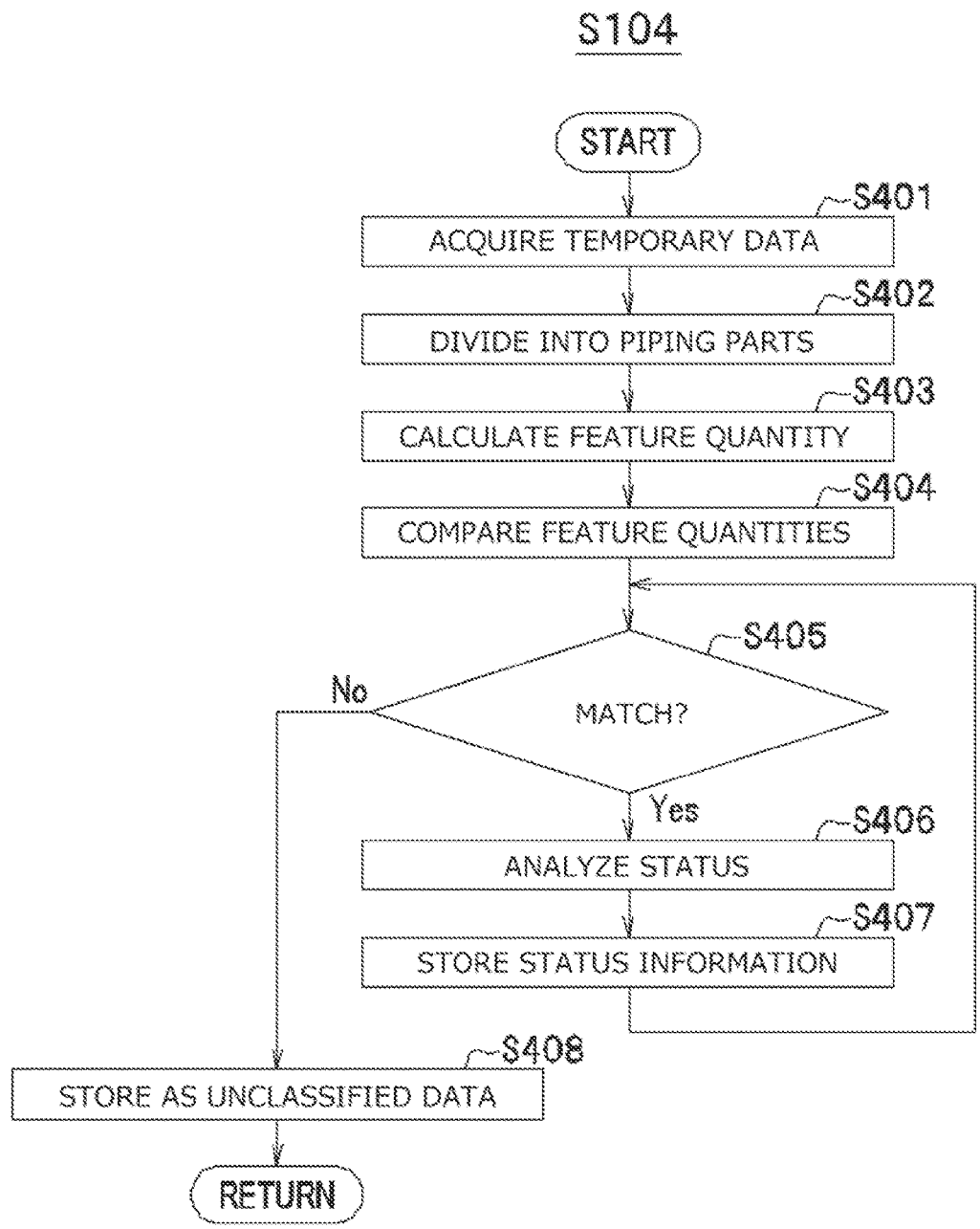

[FIG. 16]
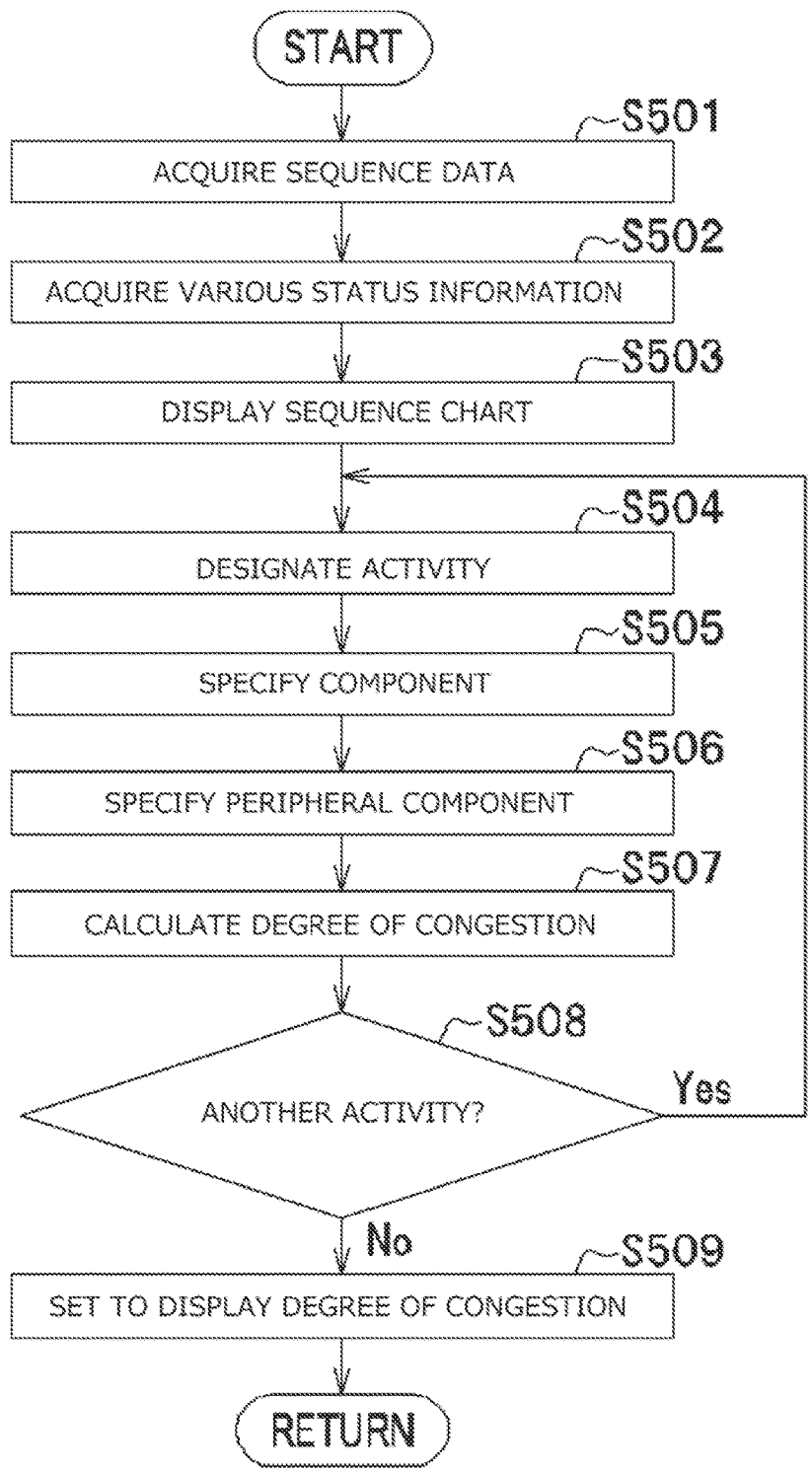

[FIG. 17]
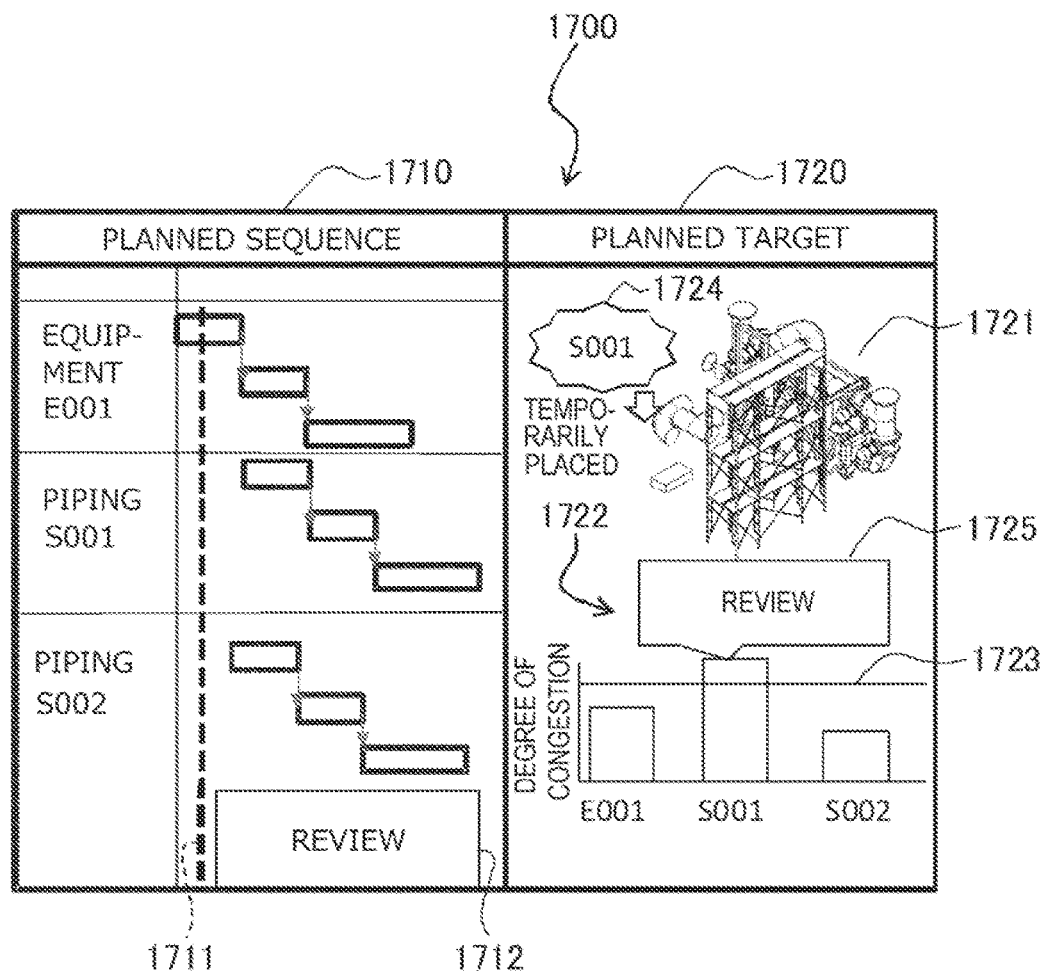

[FIG. 18]
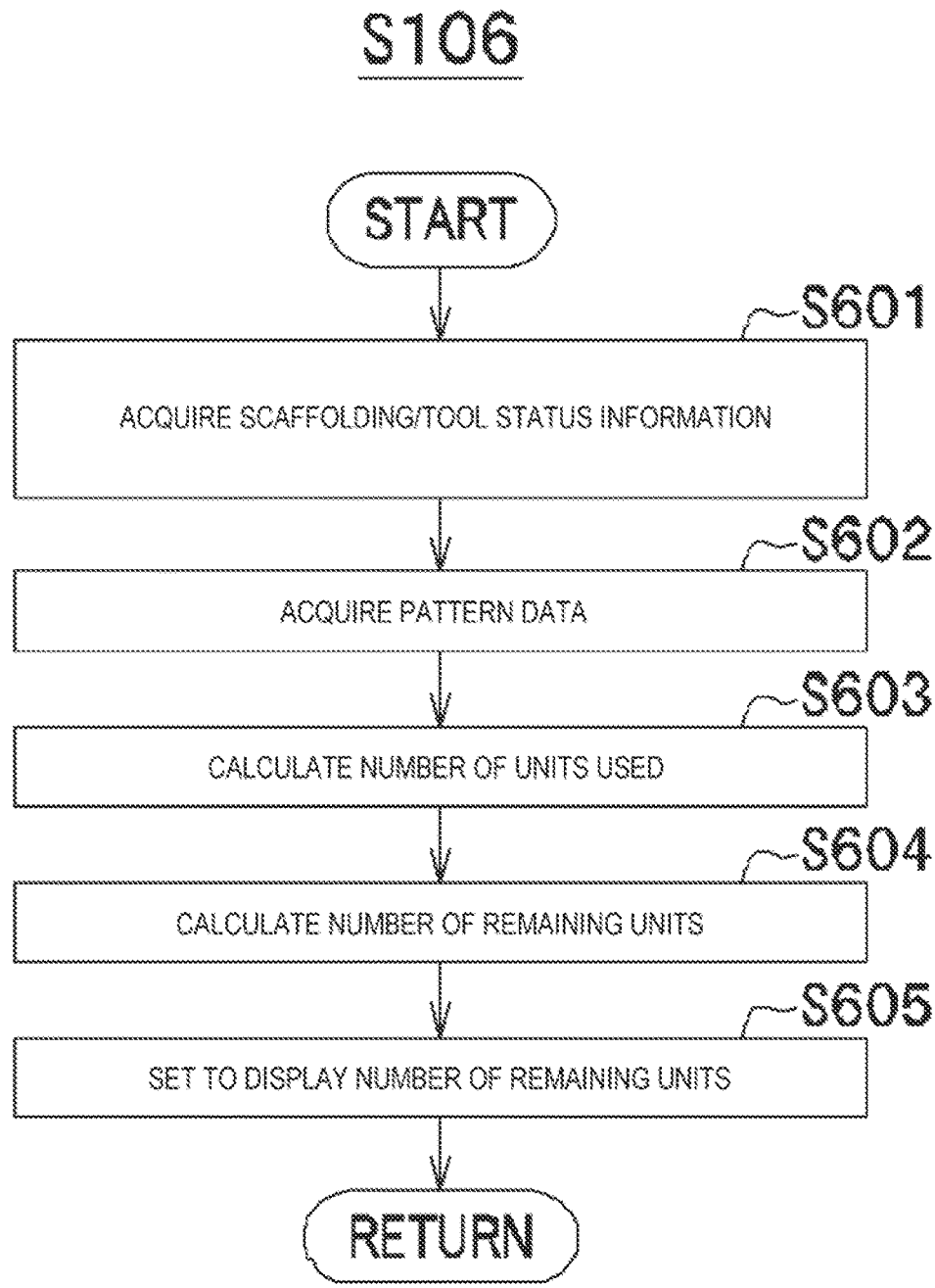

[FIG. 19]
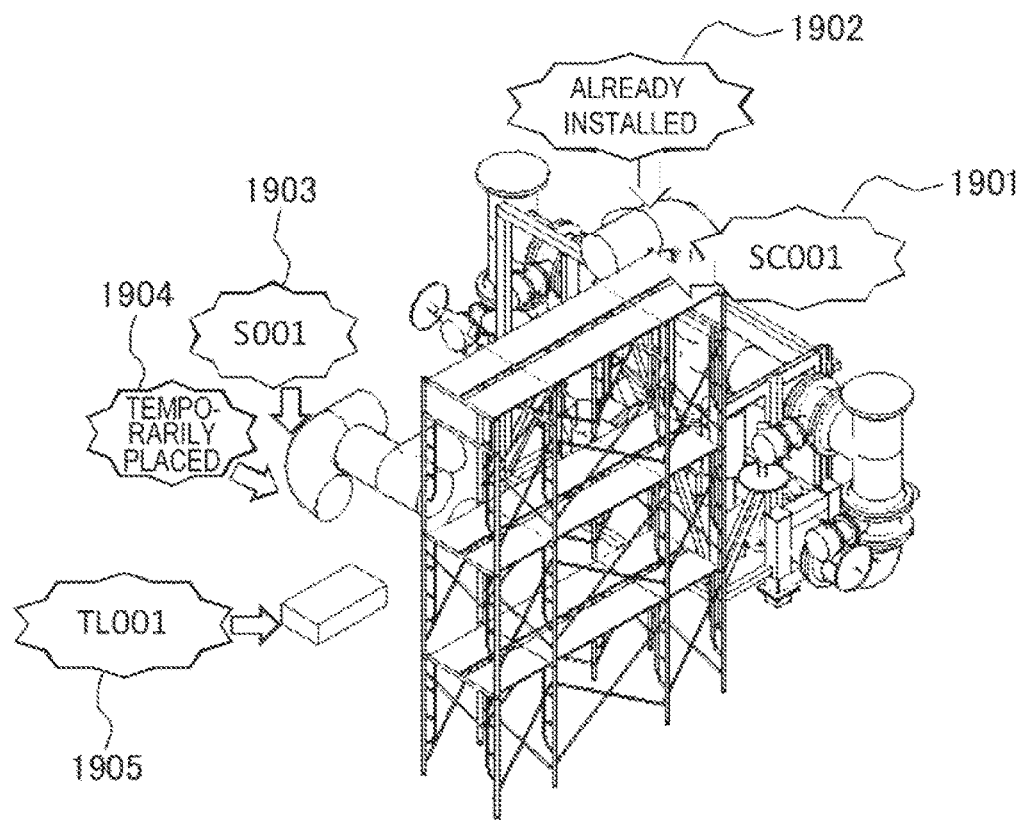

[FIG. 20]
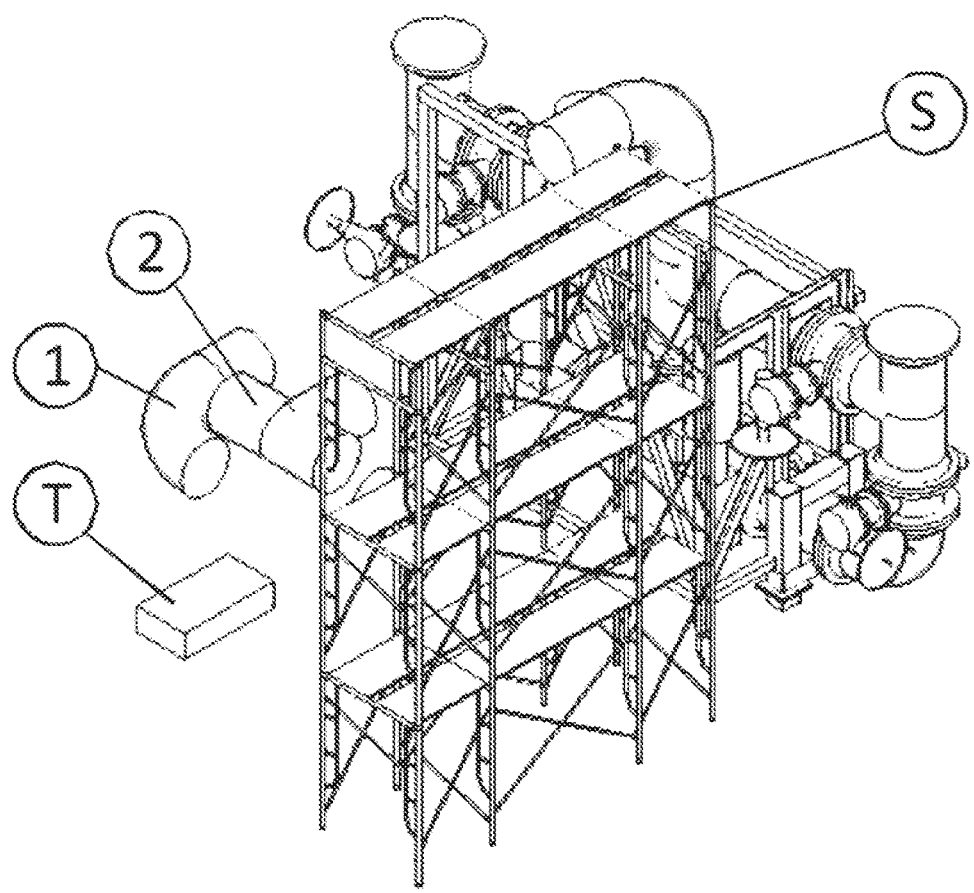

[FIG. 21]
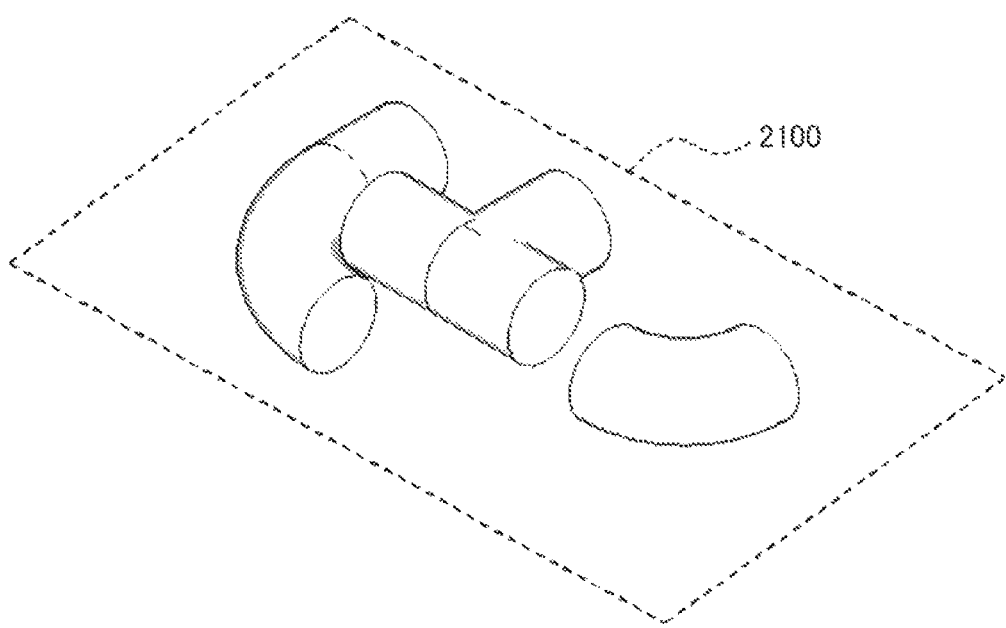

[FIG. 22]
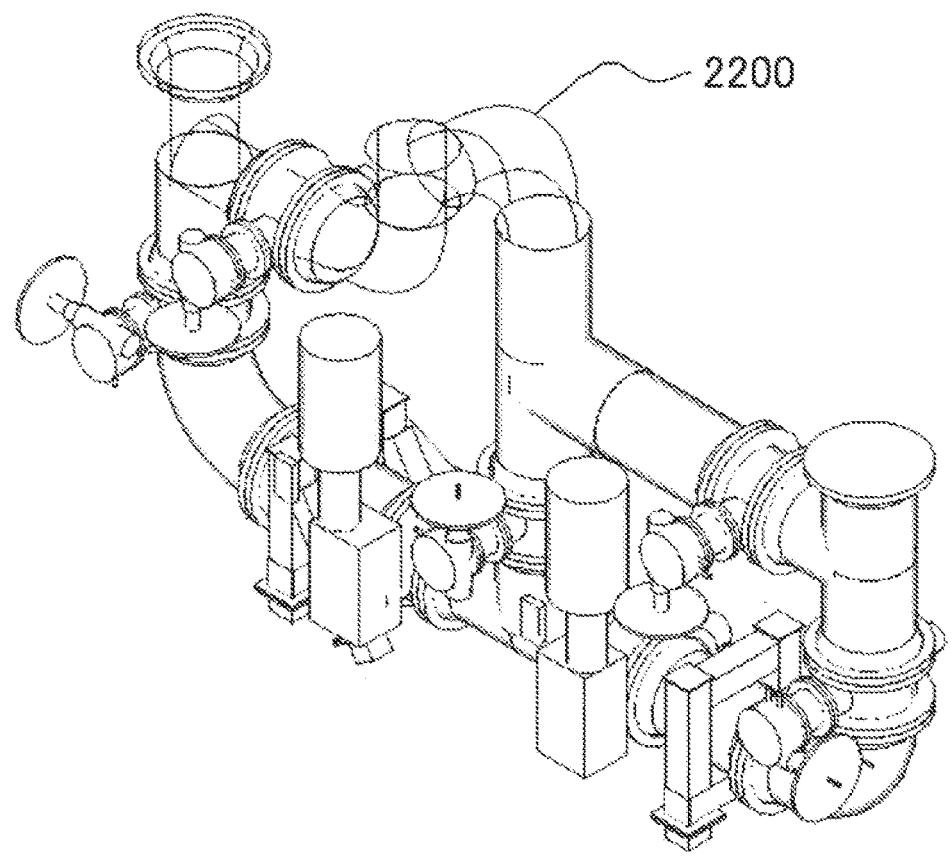

[FIG. 23]
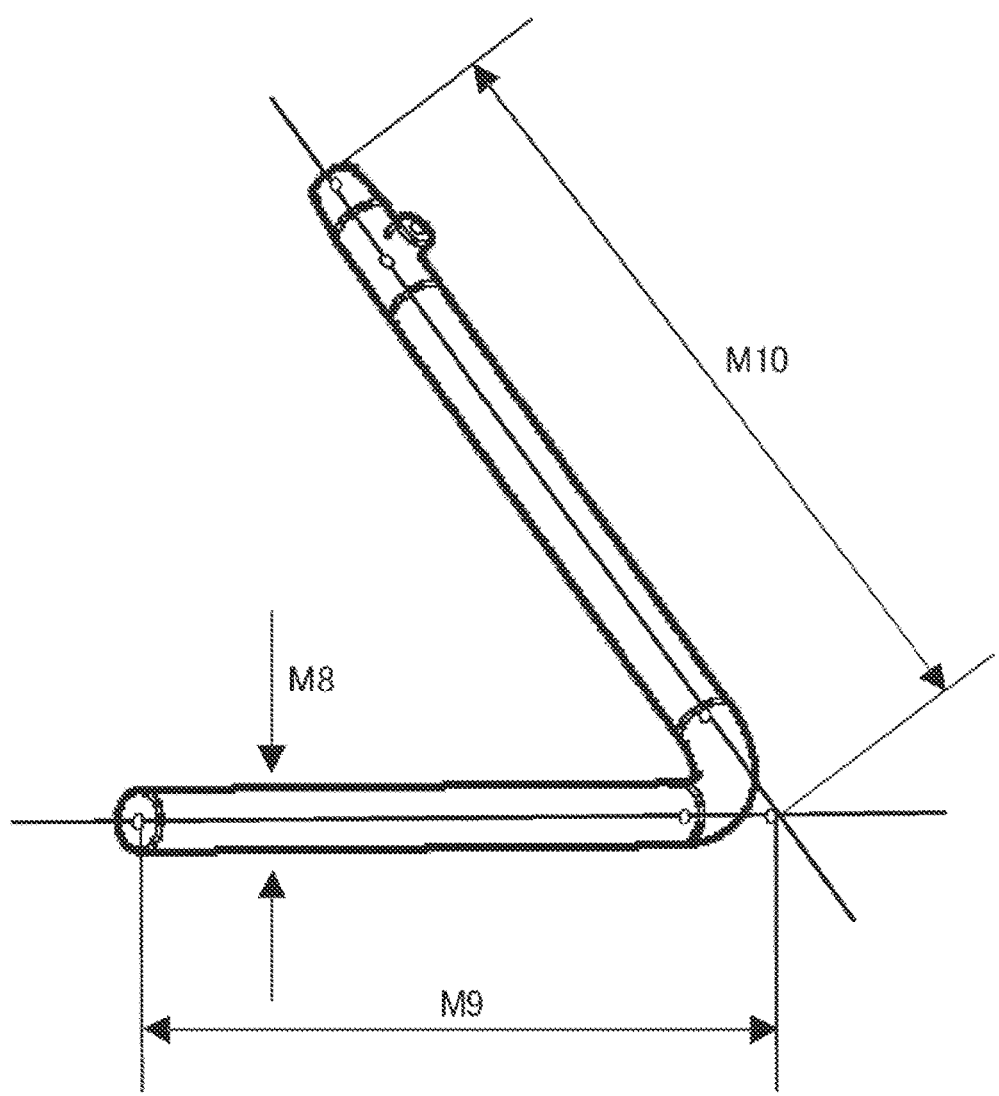

CONSTRUCTION FIELD MANAGEMENT METHOD AND CONSTRUCTION FIELD MANAGEMENT DEVICE

TECHNICAL FIELD

The present invention relates to the technique of a construction field management method and construction field management device used for management of a construction field.

BACKGROUND ART

A device for managing the status of progress in the construction field of a plant or the like is disclosed.

For example, Patent Literature 1 discloses a three-dimensional coordinate position evaluation method and evaluation device in which three-dimensional coordinates are calculated based on laser beams, three-dimensional CAD (computer aided design) data of the piping is created, and the three-dimensional data of the piping is compared with three-dimensional data from the design stage.

Also, Patent Literature 2 disclose a construction method and erection accuracy management method for a structure in which three-dimensional data is measured as point group data by a three-dimensional laser scanner, the completed shape of a connection part of a worked structure is expressed as a CAD graphic image, and the drawing and specification data of the connection part is collated with the point group data.

Patent Literature 3 discloses a monitoring moving unit, foreign matter detection sensor, and road maintenance management system in which image analysis of a laser image of a road surface is carried out using a He—Ne (helium-neon) laser, based on facility information such as the shape of the road surface, and if there is a foreign matter, whether the irregularity exceeds a detection threshold value or not is determined, thus detecting the foreign matter.

Moreover, Patent Literature 4 discloses an equipment/tool management system in which data of the position of a tool is acquired via the GPS (global positioning system) and the position of the tool is managed.

Also, Patent Literature 5 discloses a construction status visualization system in which scaffolding data is created, based on a three-dimensional shape model of a construction target created by CAD and construction sequence data, and is displayed simultaneously with the three-dimensional shape model.

CITATION LIST

Patent Literature

PTL 1: JP-A-2005-331383
PTL 2: JP-A-2009-46946
PTL 3: JP-A-2005-275723
PTL 4: JP-A-2000-357010
PTL 5: JP-A-2010-108321

SUMMARY OF INVENTION

Technical Problem

When constructing a power plant or the like, the designer creates a three-dimensional shape model of the plant in the completed state, as design data. However, when working to construct the plant, workers may temporarily place materials such as piping in the construction area, or lift piping to a predetermined position by using a scaffolding and with equipment and tools and then carryout welding after tentative fastening, or carry out various inspections. The temporary placement status of the materials, the scaffolding, the equipment and tools or the like is not included in the design data. Therefore, the construction plan is formed, based on an experienced person's decision taking into account how much space such materials occupy in the construction area.

Also, the use of the techniques disclosed in Patent Literatures 1 to 5 has a problem that even if the data of the scaffolding, the tools and the temporarily build object is taken in as a three-dimensional shape model based on the measurement of the field under construction, the system cannot present the status of the work in progress to the workers.

The present invention is made in view of the foregoing circumstances. An object of the invention is to enable easy acquisition of an element that is not design data.

Solution to Problem

In order to solve the foregoing problem, according to the invention, a construction field management method for generating construction field management information used to manage a construction field includes causing a construction field management device to acquire measurement data that is three-dimensional shape data measured by a measurement device, and compare design data that is three-dimensional shape data of a design model created by a designer, with the acquired measurement data, thus extracting non-design data that is an element which is not the design data, from the measurement data Other solutions will be described in the embodiment.

Advantageous Effect of Invention

According to the invention, an element that is not the design data can be acquired easily.

BRIEF DESCRIPTION OF DRAWINGS

FIG. 1 It is a view showing an example of the configuration of a construction field management system according no the embodiment.

FIG. 2 It is a view showing an example of a construction field according to the embodiment.

FIG. 3 It is a view showing an example of a design model according to the embodiment.

FIG. 4 It is a view showing an example of a sequence chart according to the embodiment.

FIG. 5 It is a flowchart showing the procedure of overall processing according to the embodiment.

FIG. 6 It is a view for explaining a method for measurement processing according to the embodiment.

FIG. 7 it is a view showing an example of the data format of measurement data according to the embodiment.

FIG. 8 It is a flowchart, showing the procedure of extraction processing according to the embodiment.

FIG. 9 It is a view showing an example of a feature quantity of piping according to the embodiment.

FIG. 10 it is a view showing an example of piping status information according to the embodiment.

FIG. 11 It is a view showing an example of a non-design model according to the embodiment.

FIG. 12 It is a flowchart showing the procedure of scaffolding/tool extraction processing according to the embodiment.

FIG. 13 It is a view showing an example of pattern data according to the embodiment.

FIG. 14 it is a view showing an example of scaffolding/tool status information according to the embodiment.

FIG. 15 It is a flowchart, showing the procedure of temporarily placed component extraction processing according to the embodiment.

FIG. 16 It is a flowchart, showing the procedure of sequence display processing according to the embodiment.

FIG. 17 It is a view showing an example of a sequence chart in which the degree of congestion is shown according so the embodiment.

FIG. 18 It is a flowchart showing the procedure of utilization status detection processing according to the embodiment.

FIG. 19, It is an example of display of construction field management information acquired as a result of carrying the processing according to the embodiment.

FIG. 20 It is a view showing an example of display of the installation procedure for each component according to the embodiment.

FIG. 21 it is a view showing an example of display of a placement-prohibited range according to the embodiment.

FIG. 22 It is a view showing an example in which a non-installation part is highlighted according to the embodiment.

FIG. 23 It is a view showing verification of measurement accuracy according to the embodiment.

DESCRIPTION OF EMBODIMENTS

Next, a mode for carrying out the invention (hereinafter referred to as "embodiment") will be described in detail, referring to the drawings according to need. It should be noted that, in each drawing, similar components are denoted by the same reference signs and explanation thereof is omitted. Also, while the embodiment describes an example in which the invention is applied to a fabrication sequence for piping in a plant, the invention may also be applied to other fabrication sequences than piping, such as a construction sequence for a building.

System Configuration

FIG. 1 is a view showing an example of the configuration of a construction field management system according to the embodiment.

A construction field management system 100 has a construction field management device 1, a measurement device 2, and a CAD device 3.

The construction field management device 1 has a processing unit 10, measurement DB (database) 21, a design DB 22, a pattern DB 23, a temporary DB 24, a status information DB 25, an unclassified DB 26, a sequence DB 27, a timer 30, an input unit 40, and a display unit 50.

The input unit 40 and the display unit 50 may be another PC (personal computer) such as a client terminal, not, shown.

The processing unit 10 is configured to carry out various kinds of processing and has a measurement, unit 11, an extraction unit 12, a scaffolding/tool extraction unit 13, a temporarily placed component extraction unit 14, a sequence processing unit 15, and a utilization status detection unit 16.

The measurement unit 11 acquires the result of three-dimensional measurement by the measurement device 2 and stores the result as measurement data into the measurement DB 21.

The extraction unit 12 extracts a component drawn in design data (design model: in this embodiment, piping) and other parts (non-design model) from the measurement data stored in the measurement DB 21.

The scaffolding/tool extraction unit 13 extracts data of scaffoldings, tools and the like from the non-design model data (non-design data), based on pattern data stored in the pattern DB 23, and detects the status of the data.

The temporarily placed component extraction unit 14 extracts a temporarily placed component (non-installed element) that is a design model (piping) temporarily placed on the floor or the like, from the non-design data, and detects the status of the component.

The sequence processing unit 15 displays a sequence chart and the statuses extracted and detected by the respective units 11 to 14, on the display unit 50. Moreover, if a certain component (piping or the like) is designated via the input unit 40, the sequence processing unit 15 calculates the degree of congestion around the component and displays the degree of congestion on the display unit 50. The degree of congestion will be described later.

The utilization status detection unit 16 calculates the number of remaining scaffoldings and tools or the like and displays the numbers on the display unit 50.

In the measurement DB 21, the measurement data measured by the measurement device 2 and stored by the measurement unit 11 is stored.

In the design DB 22, the data of the design model such as piping created by the CAD device 3 or the like (design data) is stored.

In the pattern DB 23, the pattern data of scaffoldings and tools or the like created by the CAD device 3 or the like is stored.

In the temporary DB 24, the result of processing by each unit is stored as temporary data.

In the status information DB 25, the status of scaffoldings, tools, and temporarily placed components or the like is stored as status information.

In the unclassified DB 26, shape data that is not classified as any of design model, scaffoldings/tools and temporarily placed components is stored.

In the sequence of DB 27, sequence data that is data relating to the sequence chart is stored.

The timer 30 measures time. The input unit 40 is an input device such as a keyboard. The display unit 50 is a display device such as a display.

The measurement device 2 is a laser measurement device such as a three-dimensional laser scanner and measures a real object in the space. The CAD device 3 creates design data and pattern data.

The processing unit 10 and the respective units 11 to 16 are embodied as programs stored in a ROM (read only memory) or HD (hard disk), not shown, are developed in a RAM (random access memory) and executed by a CPU (central processing unit).

Example of Construction Field

FIG. 2 is a view showing an example of a construction field according to the embodiment.

In the example of a plant under construction 200 in the plant construction field shown in FIG. 2, there is an installed product (piping 201), a piping part 202 in a temporarily placed state which is waiting to be installed after being carried into the construction field, a scaffolding 203 for construction, and a tool 204 such as a welder.

Example of Design Model

FIG. 3 is a view showing an example of a design model according to the embodiment.

Unlike the construction field shown in FIG. 2, in the design model, which is a model at the time of designing, there is no scaffolding, tool or piping in a temporarily placed state. There is only a design model 301 that is a three-dimensional shape mode in a completed state.

Such a design model is stored as design data in the design DB 22.

Sequence Chart

FIG. 4 is a view showing an example of a sequence chart according to the embodiment.

A sequence chart 401 includes activities 411 indicating work items with respect to each of equipment "E001", piping "S001", piping "S002" or the like.

Here, the activities 411 form a Gantt chart showing a sequence period. As shown in FIG. 4, each activity corresponds to a piece of equipment or a component such as piping and corresponds to design data representing each component.

Also, the "E001", "S001", "S002" and the like are identification names of the respective components. Moreover, the "equipment" is a kind of tool.

Such a sequence chart 401 is created by the manager and stored as sequence data in the sequence DB 27.

It should be noted that "temporary setting" refers to provisional setting prior to setting. After carrying out temporary setting, the worker verifies interference with other components or the like and the degree of congestion, later described, and carries out actual "setting" if there is no problem.

Hereinafter, the processing procedure of a construction field management method in the embodiment will be described along FIGS. 5 to 23 while referring to FIG. 1 according to need.

Overall Processing

Next, the overall processing of the construction field management method in the embodiment will be described along FIG. 5 while referring to FIG. 1. Details of each processing in FIG. 5 will be described later.

FIG. 5 is a flowchart showing the procedure of the overall processing according to the embodiment.

Before the processing according to FIG. 5, the designer creates a design model of piping or the like, using the CAD device 3, and stores the data of the created design model as design data in the design DB 22. At this point, the designer also registers a feature quantity (later described) for each piping, in the design data. Moreover, the designer creates pattern data that is data of shape patterns of scaffoldings and tools, using the CAD device 3, and stores the pattern data in the pattern DB 23. Catalog data or the like may be used for the pattern data.

Also, the manager creates the sequence chart as shown in FIG. 4, using a client, not shown, or the like, and stores the sequence chart in the sequence DB 27.

Then, measurement processing is carried out by the measurement device carrying out measurement in the construction field (S101).

Next, the extraction unit 12 carries out extraction processing to extract the design model (piping) and a non-design model part (including a scaffolding and tool, and temporarily placed piping or the like) that is a part which does not correspond to the design model, from measurement result data that is the result of the measurement processing in step S101 (S102).

Subsequently, the scaffolding/tool extraction unit 13 carries out scaffolding/tool extraction processing to extract a scaffolding/tool part from the non-design model part extracted in step S102 and detect the status of the scaffolding and tool (S103).

Next, the temporarily placed component extraction unit carries out temporarily placed component extraction processing to extract a temporarily placed design model, part (piping part) from the non-design model part and detect the status of the temporarily placed design model part (S104).

Then, the sequence processing unit 15 carries out sequence display processing to display the status of the scaffolding and tool and the status of the temporarily placed component, together with the sequence chart, on the display unit 50, and to calculate the degree of congestion (later described) around the design model component (piping part) related to an activity selected via the input unit 40 and set the display unit 50 to display the degree of congestion (S105).

Subsequently, the utilization status detection unit 16 carries out utilization status detection processing to calculate the utilization status of the scaffolding and tool and set the display unit 50 to display the utilization status (S106).

Finally, the processing unit 10 carries out display processing to display the results of the processing in steps S101 to S106, on the display unit 50 (S107).

Hereinafter, details each processing will be described.

Measurement Processing: S101

FIG. 6 is a view for explaining the method for the measurement processing accord ng to the embodiment.

For example, the measurement device 2 as a laser measurement device casts a laser onto the plant under construction 200 and measures the distance of each part forming the plant under construction, based on the reflected light. The measurement device 2 transmits the distance between the measurement device 2 and each part as the result of measurement to the measurement unit 11 of the construction field management device 1. Also, marks 611 to be used for absolute measurement of the distance are appended to the plant under construction 200.

As shown FIG. 6, since the measurement device 2 measures the plant under construction 200 from plural places, the result of three-dimensional measurement can be acquired.

Based on the result of measurement acquired from each measurement device 2, the measurement unit 11 converts the distance of the result of measurement at each measurement device 2 into coordinates and stores the coordinates as measurement data in the measurement DB 21.

FIG. 7 is a view showing an example of the data format of the measurement data according to the embodiment.

As a result of the conversion by the measurement unit of the distance of the result of measurement at each measurement device 2 into coordinates, the results of measurement at multiple points on the plant under construction 200 (FIG. 2) are acquired. In this embodiment, this is called point group data. As shown in FIG. 7, the point group data includes the coordinate values of X, Y and Z, the colors of R (red), G (green) and B (blue), and time of measurement (in FIG. 7, described as "time"). In addition, the reflection intensity of the laser beam may be stored in the measurement data. As for the color data, a digital camera, not shown, may be installed together with the measurement device 2, and as the measurement unit 11 compares an image from this digital camera with the coordinates and shape in the measurement data, the color data in the point, group is acquired.

Also, time of measurement (time) is the time acquired by the measurement unit 11 from the timer 30, and for example, the time when the measurement unit 11 acquires the result of measurement from the measurement device 2.

Extraction Processing: S102

FIG. 8 is a flowchart showing the procedure of the extraction processing (S102 in FIG. 5) according to the embodiment.

First, toe user inputs information about toe construction area to be a processing target, via the input unit 40. Then, the extraction unit 12 acquires construction area identification information, based on the inputted information about the construction, area, for example, based on construction area information or the like, not shown. Then, the extraction unit 12 acquires measurement data corresponding to the construction area identification information (S201). Moreover, the extraction unit 12 acquires design data (S202) The construction area information is, for example, information in which a construction area name is associated with construction area identification information.

Next, the extraction unit 12 carries out extraction of a piping part (that is, a design model part: design data element) from the result of construction field measurement (S203). For the extraction of the piping part, it conceivable to utilize edge extraction based on the color data of the piping in the design model or image recognition processing, contour extraction based on Hough transform, or the like. It should be noted that the part extracted in this case is not necessarily fabricated and may include, for example, an object placed on the floor or the like.

Next, if the design model part includes a piping part and multiple piping parts are extracted, the extraction unit 12 divides the extracted piping into each piping part (pipe spool) (S204). If the number of the piping parts is small, the extraction unit 12 may omit the processing of step S204.

Subsequently, the extraction unit 12 calculates the feature quantity for the extracted piping part (S205). If the design model is of piping, as in the embodiment, pipe length, pipe caliber or the like may be considered as the feature quantity. However, this is not limiting and other feature quantities may be used.

FIG. 9 is a view showing an example of the feature quantity of the piping according to the embodiment.

As shown in FIG. 9, based on the point group data of the measurement data, center lines of the piping can be found as L1 to L3, and respective points M1 to M7 can be found from the end points of the piping and the points of intersection of the center lines. The coordinates at the reference signs M1 to M7 serve as feature quantities. Here, the feature point M5 is the point of intersection between the center lines L2 and L1. The feature point M3 is the point of intersection between the center lines L1 and L3.

The explanation goes back to FIG. 8.

Subsequently, the extraction unit 12 compares the feature quantity of the piping part registered in advance in the design data, with the feature quantity calculated in step S205 (S206), and specifies the identification name or the like of the piping, based on the matching feature quantity, and analyzes the status of the piping part, based on the direction or the like of the feature quantity (S207). At this point, if the direction of the feature quantity of the piping part that is detected (for example, the direction of a line connecting one feature quantity to another feature quantity) or the like coincides with the feature quantity in the design data, the extraction unit 12 analyzes the status of the piping part by determining that this piping part is already installed, or the like. It should be noted that the feature quantity used for the status of the piping part is not limited to the feature quantity shown in FIG. 9.

The extraction unit 12 stores the status information of the piping that is the result of the analysis in step S207, as piping status information or the like in the status information DB 25 (S208). The information stored here as piping status information will be described later while referring to FIG. 10. Here, a piping part that is not determined as already installed is classified as non-design model and processed in the temporarily placed component extraction processing, described later. However, if it becomes clear at this point that the piping part that is determined as not installed yet is placed on the floor or the like, the extraction unit 12 may register the status of the piping part as "temporarily placed" in the piping status information.

Then, the extraction unit 12 determines whether the processing of steps S206 to S208 is complete or not with respect to all the divided piping parts (S209).

If the processing is not complete with respect to all the piping parts as the result of step S209 (S209→No), the extraction unit 12 returns the processing to step S206 and carries out the processing for the next piping part.

If the processing is complete with respect to all the piping parts as a result of step S209 (S209→Yes), the extraction unit 12 stores the point group data of the other parts than the piping part determined as "already installed", as temporary data in the temporary DB 24 (S210), and returns the processing to step S103 in FIG. 5.

FIG. 10 is a view showing an example of the piping status information according to the embodiment.

The piping status information includes "component ID (identification)", "work diagram number", "construction area", "status", "reference coordinates" and like.

Here, the "component ID" is the identification information of a target component (here, the piping part). As the "work diagram number", the diagram number in the design data is stored. As the "construction area", the identification information of a target construction area, inputted in the stage preceding step S201 (FIG. 8), is stored. As the "status", the status of the piping part stored in step S208 in FIG. 8 is stored.

Here, in the field of "status" in FIG. 10, "installed" is entered for component ID "S001" and "temporarily placed" is entered for "S002". The status information of "temporarily placed" for "S002" is information registered in the temporarily aced component extraction processing, described later. At the point when the processing of FIG. 8 is ended, the "status" of "S002" is blank.

The "reference coordinates" are the coordinates of a reference position in the corresponding piping part. For example, the coordinates may be of an intermediate position in the piping or a pipe opening and calculated by the extraction unit 12 or the temporarily placed component extraction unit 14 as one of the above feature quantities and stored in the piping status information, or the like.

Non-Design Data

FIG. 11 is a view showing an example of the non-design model (that is, the point group data stored as temporary data) at the point when the processing of FIG. 8 is ended.

At the point when the processing of FIG. 8 is ended, the point group data about a plant under construction 200a in which the installed piping is deleted, of the plant under construction 200 (FIG. 2), is stored as temporary data in the temporary DB 24, as shown in FIG. 11. That is, the temporary data at the time when the processing of FIG. 8 is ended includes the point group data corresponding to the piping 202 in the temporarily place state, the scaffolding 203 and the tool 204.

Scaffolding/Tool Extraction Processing: S103

FIG. 12 is a flowchart showing the procedure of the scaffolding/tool extraction processing (S103 in FIG. 5) according to the embodiment.

First, the scaffolding/tool extraction unit 13 acquires temporary data (S301) and acquires pattern data (S302).

FIG. 13 is a view showing an example of the pattern data according to the embodiment.

The pattern data is a shape library utilized to recognize the status of the scaffolding and tool in the processing of FIG. 12.

In the example of FIG. 13, the pattern data includes "type", "name", "parameter", and "shape data".

As the "type", an identifier indicating the type of each scaffolding/tool is stored. As the "name", the name of each scaffolding/tool is stored. As the "parameter", in the case of a scaffolding (see "type: SC"), "number of steps", "length", "width", "number of units" (number of units available for use) and the like are stored, and in the case of a tool (see "type: WM"), "output", "size", "number of units" (number of units available for use) and the like are stored.

As the "shape", a three-dimensional shape model of each scaffolding/tool or the like is stored.

The explanation goes back to FIG. 12.

Next, the scaffolding/tool extraction unit 13 compares the shape of the point group data in the temporary data, with the "shape" in the pattern data (S303).

Then, the scaffolding/tool extraction unit 13 determines whether there is a matching pattern among the non-design models with respect to the pattern data or not (S304). Here, the scaffolding/tool extraction unit 13 carries out the determination based on the shape comparison. However, the determination in step S304 may be carried out by calculating the feature quantity of the point group data in the temporary data and then comparing this feature quantity with the feature quantity stored in advance in the pattern data.

If there is a matching non-design model, as a result of step S304 (S304→Yes), the scaffolding/tool extraction unit 13 specifies the corresponding non-design model (for example, a scaffolding, tool or the like), based on the "shape data" in the pattern data and the shape of the detected non-design model, and analyzes the status of the non-design model (S305) In the analysis of the status of the non-design model, for example, "already installed" is given if all the model patterns and shapes of the scaffolding match, and "now being installed" or the like is given if the shape of a part of the scaffolding matches but the other shapes don't match.

In this embodiment, the scaffolding/tool extraction unit 13 analyzes the status of the scaffolding/tool, based on shape comparison. However, the status may be analyzed by calculating the feature quantity of the point group data in the temporary data and then comparing this feature quantity with the feature quantity stored in advance in the pattern data. The analysis method in this case is similar to step S207 in FIG. 8.

Then, the scaffolding/tool extraction unit 13 stores status information that is the result of the status analysis, as scaffolding/tool status information or the like in the status information DB 25 (S306). The information stored as the scaffolding/tool status information in this case will be described later with reference to FIG. 14.

After step S306, the scaffolding/tool extraction unit 13 returns the processing to step S303 and determines whether there is another non-design model that matches the "shape" of the pattern data or not.

Meanwhile, if there is no matching non-design model as a result of step S303 (S304→No), the scaffolding/tool extraction unit 13 overwrites the temporary data by saving point group data in which no pattern that matches the pattern data, of the point group data of the temporary data is detected, and thus updates the temporary data (S307), and then returns to step S104 in FIG. 5.

Scaffolding/Tool Status Information

FIG. 14 is a view showing an example of the scaffolding/tool status information according to the embodiment.

The scaffolding/tool status information includes "component ID", "classification", "type", "construction area", "name", "status", and "reference coordinates".

Here, the "component ID" is the identification information of a target component (here, a scaffolding/tool). As the "classification", information about the classification of the scaffolding/tool is stored. The "type", which is similar to the "type" in FIG. 13, is type of the scaffolding/tool. As the "construction area", the identification information of a target construction area inputted in the stage preceding FIG. 8 is stored. As the "status", the status of the scaffolding/tool stored in step S306 in FIG. 13 is stored.

The "reference coordinates" are the coordinates of a reference position of the corresponding scaffolding/tool. For example, the position of the center of gravity of the scaffolding/tool, or the like, is calculated the scaffolding/tool extraction unit 3 and stored in the scaffolding/tool status information.

While the scaffolding/tool status information in this embodiment includes the status information of the scaffolding/tool, the status information of a temporarily placed piping detected in the temporarily placed component extraction processing, described later, may also be stored.

Temporarily Placed Component Extraction Processing: S104

FIG. 15 is a flowchart showing the procedure of the temporarily placed component extraction processing (S104 in FIG. 5) according to the embodiment.

First, the temporarily placed component extraction unit 14 acquires the temporary data updated in step S307 in FIG. 12 (S401).

Next, the temporarily placed component extraction unit 14 divides the point, group data in the temporary data into piping parts (pipe spools) (S402). Here, the temporarily placed component extraction unit 14 registers the data that cannot be divided into piping parts as an undivided part or the like.

Subsequently, the temporarily placed component extraction unit 14 calculates the feature quantity of the pipe parts divided in step S402 (S403). The feature quantity to be calculated includes pipe length, caliber, bending point and the like.

Then, the temporarily placed component extraction unit 14 acquires the feature quantity stored in the design data, compares the acquired feature quantity of the design data with the feature quantity of the piping parts calculated in step S403 (S404) and determines whether an object that matches the feature quantity of the design data exists in the temporary data stored in the temporary DE 24 or not (S405). That is, the temporarily placed component extraction unit 14 determines whether or not there is an object having an existence position that does not match any element of the design data but having the feature quantity that matches an element of the design data.

If an object that matches the feature quantity of the design data exists in the temporary data as a result of step S405 (S405→Yes), the temporarily placed component extraction unit 14 carries out status analysis to determine that the status of the piping in the temporary data with the matching feature quantity is a temporarily placed state (S406).

Then, the temporarily placed component extraction unit 14 stores status information (here, "temporarily placed") that is the result of the status analysis, as piping status information in the status information DE 25 (S407) The information stored as the piping status information in this case is already explained with reference to FIG. 10 and therefore will not be described further.

After step S407, the temporarily placed component extraction unit 14 returns the processing to step S405 and determines whether there is another part with a matching feature quantity in the temporary data or not.

If no object matching the feature quantity of the design data exists in the temporary data as a result of step S405 (S405→No), the temporarily placed component extraction unit 14 stores the point group data of the part in the temporary data that does not match the feature quantity stored in the design data, as unclassified data in the unclassified DB 26 (S408), and returns to step S105 in FIG. 5.

The status information of the temporary placement information is already explained with reference to FIG. 10 and therefore will not be described further.

It should be noted that while the status of the piping part detected in the processing of step S405 is analyzed as "temporarily placed" in this case, the temporarily placed component extraction unit 14 may analyze the status of a piping part that has a matching feature quantity in step S405 and that is in contact with the floor, as "temporarily placed". Also, if a piping part that has a matching feature quantity and that is not in contact with the floor is detected, the temporarily placed component extraction unit 14 may analyze the status of the piping part as "now being installed" or the like.

Sequence Display Processing: S105

FIG. 16 is a flowchart showing the procedure of the sequence display processing (S105 in FIG. 5) according to the embodiment.

First, the sequence processing unit 15 acquires the sequence data from the sequence DB 27 (S501).

Subsequently, the sequence processing unit 15 acquires various kinds of status information (piping status information, scaffolding/tool status information) from the status information DB 25 (S502).

Then, the sequence processing unit 15 displays a sequence chart based on the sequence data acquired in step S501, on the display unit 50 (S503). Here, the sequence chart that is displayed is the sequence chart as shown in FIG. 4.

Next, the user designates an activity in the displayed sequence chart (S504).

The sequence processing unit 15 specifies a component (piping part or the like) corresponding to the activity, referring to the sequence data (S505). The component corresponding to the activity may be a piping part (design model component), scaffolding/tool, temporarily placed piping or the like.

Then, the sequence processing unit 15 searches for a peripheral component around the component specified in step S505, referring to the piping status information and the scaffolding/tool status information (specifically, referring to the reference coordinates of the status information), and specifies the peripheral component (S506). For example, the sequence processing unit 15 searches for a component within a predetermined range that is set in advance, such as within two meters from the center of (gravity of the component corresponding to the activity (a kind of reference coordinates). If a piping part is specified as the component, specifically, the sequence processing unit 15 detects a piping part corresponding to the activity from the piping status information, for example, using "name" or the like as a key. Then, the sequence processing unit 15 acquires the reference coordinates of the detected piping part from the piping status information. Next, the sequence processing unit 15 acquires a component having reference coordinates within a predetermined range from the detected reference coordinates, from the piping status information and the scaffolding/tool status information stored in the status information DB 25.

After step S506, the sequence processing unit 15 calculates the degree of congestion around the component corresponding to the activity, based on the specified peripheral component (S507). The degree of congestion is calculated, for example, by generating a sphere within a predetermined range from the reference coordinates of the piping part corresponding to the activity and then finding the proportion of the volume of the peripheral component to the volume of the sphere, or the like. The volume of the peripheral component is calculated based on the point group in the measurement data.

Next, the sequence processing unit 15 displays, on the display unit 50, a window prompting selection on whether to calculate the degree of congestion with respect to another activity or not. The user inputs information about whether to calculate the degree of congestion with respect to another activity or not, via the input unit 40.

Based on the inputted information, the sequence processing unit 15 determines whether to calculate the degree of congestion with respect to another activity or not (S508).

If the degree of congestion is to be calculated with respect to another activity as a result of step S508 (S508→Yes), the sequence processing unit 15 returns the processing to step S504 and calculates the degree of congestion with respect to another activity.

If the degree of congestion is not to be calculated with respect to another activity as a result of step S508 (S508→No), the sequence processing unit 15 sets the display unit 50 to display the degree of congestion calculated with respect to each activity (S509).

Sequence Chart

FIG. 17 is a view showing an example of a sequence chart in which the degree of congestion is shown, according to the embodiment.

A sequence chart 1700 of FIG. 17 includes a sequence information display section 1710 and a status display section 1720.

The content displayed in the sequence information display section 1710 is substantially similar to the sequence chart shown in FIG. 4 but different in that a time line 1711 and an activity review warning indication 1712 are shown.

In the status display section 1720, a plant under construction image 1721 as of the time of the time line 1712 (based on the time of the measure data ("time" in FIG. 7)) is shown. In a congestion degree display section 1722 below that, the degree of congestion calculated in the processing in FIG. 16 is displayed in the form of bar chart for each component corresponding to the activity.

Then, with respect to a component having a degree of congestion that exceeds a warning line 1723 in FIG. 17, "S001"), a warning is shown (sign 1724) in the plant under construction image 1721 and also an indication that prompts a review of the timing to start the activity is shown (sign 1725). With respect to the component for which the warning is shown (sign 1724), the status of the component such as "temporarily placed" is displayed as well.

The indication as denoted by the sign 1724 is displayed on the display unit 50 by the sequence processing unit 15, based on the component ID or the like in the activity and based on the reference coordinates in the piping status information and the scaffolding/tool status information, and the point group data in the measurement data.

Also, since there is a component with a degree of congestion exceeding a predetermined value (the value of the warning line 1723), an indication that prompts a review of the timing to start the activity is shown (sign 1712) in the sequence information display section 1710.

This is for the purpose of prompting the worker to review the start of the activity and rearrange the peripheral component because the high degree of congestion (that is, the periphery of the activity is congested) means an unsuitable work environment for the work.

It should be noted that while, in this embodiment, the designation of an activity causes the sequence processing unit 15 to calculate the degree of congestion around the component corresponding to the designated activity, the sequence processing unit 15 may calculate the degree of congestion around the corresponding component as the user designates the component in the plant under construction image 1721 in the status display section 1720.

Utilization Status Detection Processing: S106

FIG. 18 is a flowchart showing the procedure of the utilization status detection processing (S106 in FIG. 5) according to the embodiment.

First, the utilization status detection unit 16 acquires the scaffolding/tool status information from the status information DB 25 (S601) and acquires the pattern data (S602).

Next, the utilization status detection unit 16 calculates the number of scaffoldings/tools used (number of units used) stored in the pattern data, for each type (S603).

Then, the utilization status detection unit 16 calculates the number of remaining units of the respective scaffoldings/tools of each type, based on toe number of scaffoldings/tools (number of units available for use) stored in the pattern data and the number of units used of the scaffoldings/tools calculated in step S603 (S604), and sets the display unit 50 to display the calculated number of remaining scaffoldings/tools (S605).

FIG. 19 is an example of display of construction field management information obtained as a result of carrying out the processing according to the embodiment. FIG. 19 is what is displayed in step S106 in FIG. 5.

The processing unit 10 displays an image of the plant under construction based on the measurement data and displays component IDs 1901, 1903, 1905 and status information 1902, 1904 or the like, based on the piping status information and the scaffolding/tool status information. For the display of the component IDs 1901, 1903, 1905 and the status information 1902, 1903 or the like, the processing unit 10 decides display positions based on the reference coordinates of the piping status information and the scaffolding/tool status information.

Also, in a number of remaining units display section 1910, the number of remaining units of the scaffoldings/tools calculated in the processing in FIG. 18 is displayed for each type. In the number of remaining units display section 1910, the number of units used, which is the number of units in use, may be displayed for each type.

Also, the processing unit 10 may display the sequence chart 1700 of FIG. 17 together with the image of FIG. 19 on toe display unit 50.

By carrying out the above processing, the construction field management information that enables the user to easily recognize the status of scaffoldings/tools that are not drawn in the design data and temporarily placed design components piping parts), can be displayed.

Also, the following processing may be carried out in addition to the above process Display of Installation Procedure FIG. 20 is a view showing an example of display of the installation procedure for each component according to the embodiment.

The construction field management device may have procedure data in which the installation procedure, fabrication procedure and use procedure for the piping and the scaffoldings/tools are associated with the component IDs.

By referring to the procedure data, using the component IDs registered in the piping status information and the scaffolding/tool status information as a key, the processing unit 10 can display the installation procedure for the temporarily placed piping and the scaffolding and tool used at the time, as shown in FIG. 20.

In FIG. 20, it is indicated that the temporarily placed piping should be installed in the order of circles 1 and 2 and it is statically shown that, in this case, tool indicated by circled T and a scaffolding indicated by circled S are to be used.

Also, it is possible to display the sequence as an animation along time by the processing unit 10 referring to the sequence data.

Such display enables the user to easily visually recognize the installation procedure for the temporarily placed piping and the tool/scaffolding to be used.

FIG. 21 is a view showing an example of display of a placement-prohibited range according to the embodiment.

It is desirable that other piping parts and tools or the like should not be placed around the temporarily placed piping. Therefore, referring to the reference coordinates of the piping status information, the processing unit 10 may highlight a predetermined range from the reference coordinates of the temporarily placed piping as indicated by a sign 2100.

This enables the user to easily visually recognize the placement-prohibited range of tools and other piping parts.

FIG. 22 is a view showing an example in which a non-installed, part is highlighted, according to the embodiment.

The processing unit 10 may compare the piping on which the "status" of the piping status information is "already installed", with the design data, then detect a part (non-installed part) that is present in the design data but is not the piping that is "already installed" according to the piping status information, and highlight the part, as indicated by a sign 2200 (in FIG. 21, a rendering image).

This enables the user to easily visually recognize the part to be installed from now.

FIG. 23 is a view showing verification of measurement accuracy according to the embodiment.

The measurement, data obtained from the measurement device 2 is always accompanied by a measurement error.

Thus, the processing unit 10 may compare the feature quantity registered in the design data with the feature quantity calculated on the basis of the measurement data (calculated in step S205 in FIG. 8 or step S403 in FIG. 15) and calculates the error of the measurement data.

An example of the feature quantity that is used is the outer diameter M8 of the pipe or pipe lengths M9, M10, as shown in FIG. 22.

By thus calculating the error of the measurement data and calibrating the measurement device 2 based on this error, it is possible to obtain measurement data with a high system.

According to the embodiment, the temporarily placed state of scaffoldings, tools and construction materials that are eliminated as unnecessary objects as a result of measurement in a construction field can be grasped. Also, according to the embodiment, based on the result of this grasping, the grasp of the progress status of the current installation work and the support for future plan modifications can be made efficient.

REFERENCE SIGNS LIST 1 construction field management device
2 measurement device
3 CAD device
10 processing unit
11 measurement unit
12 extraction unit
13 scaffolding/tool extraction unit
14 temporarily placed component extraction unit (non-installed element extraction unit)
15 sequence processing unit
16 utilization status detection unit
21 measurement DB (including measurement data)
22 design DB (including design data)
23 pattern DB (including scaffolding/tool pattern data)
24 temporary DB (including non-design data)
25 status information DB (including scaffolding/tool information, information of non-installed element, status information data)
26 unclassified DP,
27 sequence DB (including sequence data)
30 timer
40 input unit
50 display unit

The invention claimed is:

1. A construction field management method for generating construction field management information used to manage a construction field, comprising:
    measuring with a laser a shape of a three-dimensional structure;
    causing a construction field management device to
        acquire measurement data that is three-dimensional shape data measured by the laser, and
        compare design data that is three-dimensional shape data of a design model created by a designer, with the acquired measurement data, thus extracting non-design data that is an element which is not the design data, from the measurement data, wherein
            the construction field management device stores scaffolding/tool pattern data including information about a shape of a scaffolding/tool in a storage unit,
            the construction field management device compares the scaffolding/tool pattern data with the extracted non-design data, thus extracting scaffolding/tool information that is the information about the scaffolding/tool from the non-design data,
            information about the number of scaffoldings and tools that are extracted is stored in the scaffolding/tool information,
            the number of units available for use of the scaffolding/tool is stored in the scaffolding/tool pattern data,
        the construction field management device,
            calculates the number of remaining scaffoldings/tools available for use, based on the scaffolding/tool information and the number of units available for use of the scaffolding/tool, and
            displays the calculated number of remaining scaffoldings/tools available for use on a display unit; and
        completing the three-dimensional structure in a design model that allows a user to visually recognize placement-prohibited range of tools and other piping parts.

2. The construction field management method according to claim 1, wherein
    the construction field management device
    compares a feature quantity stored in the design data in advance with a feature quantity calculated on the basis of the measurement data.

3. The construction field management method according to claim 1, wherein
    the construction field management device
    compares the scaffolding/tool pattern data with the extracted scaffolding/tool information, thus detecting a status of the scaffolding/tool in scaffolding/tool shape data, and
    stores information about the detected status of the scaffolding/tool into status information data.

4. The construction field management method according to claim 1, wherein
    the construction field management device
    stores a feature quantity of an element of the design data in a storage unit, and
    the construction field management device
    compares a feature quantity calculated from the extracted non-design data with the feature quantity of the element, thus extracting information of a non-installed element that is an element having an existence position that does not match the design model but having the feature quantity that matches, in the non-design data.

5. The construction field management method according to claim 4, wherein
    the construction field management device
    compares the feature quantity calculated from the extracted non-design data with the feature quantity of the element, thus detecting a status of the non-installed element included in the design data, and
    stores information about the detected status of the non-installed element into status information data.

6. The construction field management method according to claim 4, wherein
    a predetermined range around the non-installed element is highlighted.

7. The construction field management method according to claim 5, wherein
    the construction field management device
    displays, on a display unit, information about the status stored in the status information data together with a three-dimensional shape image generated on the basis of the measurement data.

8. The construction field management method according to claim 1, wherein the construction field management device
stores, in a storage unit a feature quantity of an element of the design data, and the construction field management device
compares the scaffolding/tool pattern data with the extracted non-design data, thus extracting scaffolding/tool information that is information about the scaffolding/tool from the non-design data,
compares a feature quantity calculated from the extracted non-design data with the feature quantity of the element, thus extracting information of a non-installed element that is a design model included in a non-design model,
calculates reference coordinates about each element of the element of the design data, the scaffolding, the tool, and the non-installed element, and
as one of the element of the design data, the scaffolding, the tool, and the non-installed element is selected via an input unit,
detects another element existing within a predetermined range from the selected element, based on the reference coordinates stored in status information data,
calculates a degree of congestion of the element existing within the predetermined range, based on the measurement data, and
displays the calculated degree of congestion on the display unit.

9. The construction field management method according to claim 8, wherein
the construction field management device
displays a warning on the display unit if the degree of congestion exceeds a predetermined threshold value.

10. The construction field management method according to claim 9, wherein
the construction field management device
has sequence data about a sequence chart in a storage unit, and
the construction field management device
displays the sequence chart of the sequence data on the display unit together with an image of the measurement data,
if the degree of congestion exceeds a predetermined threshold value, specifies an element for which the degree of congestion exceeds the threshold value, based on the status information data, and
displays the specified element in association with the warning, on the display unit.

11. The construction field management method according to claim 1, wherein
the construction field management device stores, in a storage unit,
a feature quantity of an element of the design data, and
a fabrication order data that is data about a fabrication order of the element of the design data and the scaffolding, and
the construction field management device
compares the scaffolding/tool pattern data with the extracted non-design data, thus extracting scaffolding/tool information that is information about the scaffolding/tool from the non-design data,
compares a feature quantity calculated from the extracted non-design data with the feature quantity of the element, thus extracting information of a non-installed element that is a design model included in the non-design data, and
displays the information about the fabrication order on a display unit, based on the status information data.

12. The construction field management method according to claim 1, wherein
the construction field management device
acquires a design data element that is an element which is not extracted as the non-design data, of the design data, and
highlights a part that does not match the design data element, of the design data, on a display unit.

13. The construction field management method according to claim 1, wherein
the construction field management device
compares a feature quantity registered in the design data with a feature quantity calculated on the basis of the measurement data, thus calculating an error in the laser measurement data.

14. A construction field management method for generating construction field management information used to manage a construction field, comprising:
measuring with a laser a shape of a three-dimensional structure;
causing a construction field management device to
acquire measurement data that is three-dimensional shape data measured by a measurement device, and
compare design data that is three-dimensional shape data of a design model created by a designer, with the acquired measurement data, thus extracting non-design data that is an element which is not the design data, from the measurement data, wherein
the construction field management device
stores, in a storage unit, scaffolding/tool pattern data including information about a shape of a scaffolding/tool, and
a feature quantity of an element of the design data, and wherein the construction field management device
compares the scaffolding/tool pattern data with the extracted non-design data, thus extracting scaffolding/tool information that is information about the scaffolding/tool from the non-design data,
compares a feature quantity calculated from the extracted non-design data with the feature quantity of the element, thus extracting information of a non-installed element that is a design model included in a non-design model,
calculates reference coordinates about each element of the element of the design data, the scaffolding, the tool, and the non-installed element, and
as one of the elements of the design data, the scaffolding, the tool, and the non-installed element is selected via an input unit,
detects another element existing within a predetermined range from the selected element, based on the reference coordinates stored in a status information data,
calculates a degree of congestion of the element existing within the predetermined range, based on the measurement data, and
displays the calculated degree of congestion on the display unit; and
completing the three-dimensional structure in a design model that allows a user to visually recognize placement-prohibited range of tools and other piping parts.

15. A construction field management method for generating construction field management information used to manage a construction field, comprising:
  measuring with a laser a shape of a three-dimensional structure;
  causing a construction field management device to
    acquire measurement data that is three-dimensional shape data measured by a measurement device, and
    compare design data that is three-dimensional shape data of a design model created by a designer, with the acquired measurement data, thus extracting non-design data that is an element which is not the design data, from the measurement data, wherein
    the construction field management device stores, in a storage unit,
    scaffolding/tool pattern data including information about a shape of a scaffolding/tool,
    a feature quantity of an element of the design data, and
    a fabrication order data that is data about a fabrication order of the element of the design data and the scaffolding, and
    the construction field management device
      compares the scaffolding/tool pattern data with the extracted non-design data, thus extracting scaffolding/tool information that is information about the scaffolding/tool from the non-design data,
      compares a feature quantity calculated from the extracted non-design data with the feature quantity of the element, thus extracting information of a non-installed element that is a design model included in the non-design data, and
    displays the information about the fabrication order on a display unit, based on a status information data; and
  completing the three-dimensional structure in a design model that allows a user to visually recognize placement-prohibited range of tools and other piping parts.

* * * * *